United States Patent
Gao et al.

(10) Patent No.: US 7,838,174 B2
(45) Date of Patent: *Nov. 23, 2010

(54) METHOD OF FABRICATING GRAYSCALE MASK USING SMART CUT® WAFER BONDING PROCESS

(75) Inventors: Wei Gao, Vancouver, WA (US); Bruce D. Ulrich, Beaverton, OR (US); Yoshi Ono, Camas, WA (US); Steven R. Droes, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 974 days.

This patent is subject to a terminal disclaimer.

(21) Appl. No.: 11/657,258

(22) Filed: Jan. 24, 2007

(65) Prior Publication Data

US 2008/0176392 A1 Jul. 24, 2008

(51) Int. Cl.
*G03F 1/00* (2006.01)
*G03C 5/00* (2006.01)

(52) U.S. Cl. .......................... 430/5; 430/321
(58) Field of Classification Search .................. 430/5, 430/321; 438/34, 48, 455, 700, 717
See application file for complete search history.

(56) References Cited

U.S. PATENT DOCUMENTS

| 5,324,623 | A | 6/1994 | Tsumori et al. | |
|---|---|---|---|---|
| 5,374,564 | A | 12/1994 | Bruel | |
| 6,071,652 | A | * | 6/2000 | Feldman et al. .............. 430/5 |
| 6,127,070 | A | * | 10/2000 | Yang et al. .................... 430/5 |
| 6,163,407 | A | | 12/2000 | Okazaki et al. |
| 7,678,512 | B2 | * | 3/2010 | Ono et al. ..................... 430/5 |
| 7,682,761 | B2 | * | 3/2010 | Gao et al. ..................... 430/5 |
| 2005/0170655 | A1 | * | 8/2005 | Bencher et al. ............. 438/700 |
| 2006/0183027 | A1 | * | 8/2006 | Lin et al. ...................... 430/5 |

FOREIGN PATENT DOCUMENTS

| JP | 4359472 | 12/1992 |
|---|---|---|
| JP | 5211128 | 8/1993 |
| JP | 7175203 | 7/1995 |
| JP | 10148704 | 6/1998 |
| JP | 2002525652 | 8/2002 |
| JP | 2004327998 | 11/2004 |
| JP | 2005531815 | 10/2005 |

* cited by examiner

*Primary Examiner*—Stephen Rosasco
*Assistant Examiner*—Stewart A Fraser
(74) *Attorney, Agent, or Firm*—Law Office of Gerald Maliszewski; Gerald Maliszewski

(57) ABSTRACT

A method of fabricating a grayscale mask includes preparing a silicon wafer; depositing a layer of $Si_3N_4$ directly on the silicon wafer; implanting $H^+$ ions into the silicon wafer to form a defect layer; depositing a first layer of $SiO_xN_y$ directly on the $Si_3N_4$ layer; depositing a layer of SRO directly on the first layer of $SiO_xN_y$; patterning and etching the SRO layer to form a microlens array in the SRO layer; depositing a second layer of $SiO_xN_y$ on the SRO microlens array; CMP to planarize the second layer of $SiO_xN_y$; bonding and cleaving the planarized $SiO_xN_y$ to a quartz plate to form a graymask reticle; etching to remove silicon from the bonded structure; etching to remove $SiO_xN_y$ and $Si_3N_4$ from the bonded structure; and cleaning and drying the graymask reticle.

17 Claims, 3 Drawing Sheets

METHOD OF FABRICATING GRAYSCALE MASK USING SMART CUT® WAFER BONDING PROCESS

FIELD OF THE INVENTION

This invention relates to microlens fabrication, and specifically to a method to transfer a completed silicon-rich oxide (SRO) grayscale mask to a square-shaped reticle quartz plate by wafer bonding technology incorporating the Smart Cut® process.

BACKGROUND OF THE INVENTION

A microlens is an optical element in either CCD or CMOS imager. By putting a microlens on top of a photodetector, the strength of generated electrical signals is increased, as is the sensitivity of the image sensor. Methods of making microlens in a cost effective way have been described in U.S. Pat. No. 5,324,623, granted Jun. 28, 1994 to Tsumori et al. for Microlens forming method, and U.S. Pat. No. 6,163,407, granted Dec. 19, 2000, to Okazaki et al., for Microlens array and method of forming same and solid-state image pickup device and method of manufacturing same. The technology described therein includes forming a lens shape in photoresist, followed by etching pattern transfer to final lens material. The methods to form lens shape on photo-resist include photo-resist reflow, or direct lens shape patterning from grayscale mask. The photo-resist reflow method has a fill factor limitation, and the grayscale mask is normally fabricated by e-beam photolithography, e.g., as used by Canyon Material. Inc., which is both slow and expensive. A process technology to fabricate grayscale mask in both a cost effective way by using silicon rich oxide (SRO) as a light attenuating material has been developed. By forming the SRO layer into the lens shape and by putting the film on the reticle plate in the litho tool, the pattern printed on the photo-resist surface will have the lens shape accordingly base on the specifications of the litho tool, e.g., a 5× reduction rate on the tool. The photolithographic method of fabricating prototype SRO based grayscale mask is disclosed in U.S. patent application Ser. No. 11/657,326, filed Jan. 24, 2007, for Method of Making a Grayscale Reticle Using Step-Over Lithography for Shaping Microlenses, which is incorporated herein by reference, wherein SRO is deposited on quartz substrate, and patterned and etched into the microlens array.

In order for the grayscale mask to be used in a fabrication process, it has to be made on a reticle plate having required alignment features so that it may be mounted, and used on a litho tool. A reticle used in a litho tool is normally made out of square quartz plate while conventional IC processing tools are designed to handle round shape wafers. Fabrication of a SRO-based grayscale mask on a square quartz plate in an IC processing line is not feasible without major renovation to many of the process systems. One way to accomplish this is to use a transfer technology which allows a completed SRO grayscale mask, formed on a round wafer, to be placed on a square quartz plate.

Wafer bonding technology is used in the IC industry as one method to form a silicon on insulator (SOI) device, which in turn facilitates high-performance CMOS technologies. In wafer bonding technology, the proton, or $H_2$ ion implantation, at the beginning of a process, and cleaving or splitting at the end of a process, is required in the Smart Cut® method.

SUMMARY OF THE INVENTION

A method of fabricating a grayscale mask includes preparing a silicon wafer; depositing a layer of $Si_3N_4$ directly on the silicon wafer; implanting H+ ions into the silicon wafer to form a defect layer; depositing a first layer of $SiO_xN_y$ directly on the $Si_3N_4$ layer; depositing a layer of SRO directly on the first layer of $SiO_xN_y$; patterning a microlens array on the SRO layer; etching the SRO layer to form a microlens array in the SRO layer; depositing a second layer of $SiO_xN_y$ on the SRO microlens array; CMP to planarize the second layer of $SiO_xN_y$; bonding the planarized $SiO_xN_y$ to a quartz plate to form a graymask reticle; cleaving the silicon wafer along the defect layer; etching to remove silicon from the bonded structure; etching to remove $SiO_xN_y$ and $Si_3N_4$ from the bonded structure; and cleaning and drying the graymask reticle.

It is an object of the invention to form a grayscale mask using a silicon wafer for initial mask fabrication.

It is another object of the invention to provide a grayscale mask using a wafer bonding and cleaving process to leave the mask fabricated on a silicon wafer on a quartz reticle.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The method of the invention provides for transfer of a completed SRO grayscale mask, formed on a round silicon wafer, to a square quartz plate reticle by wafer bonding, specifically, by using Smart Cut® wafer bonding technology. The method of the invention allows microlens fabrication to be performed on a silicon wafer, instead of on a quartz wafer. This eliminates many compatibility issues which normally occur during device fabrication on transparent wafers. As the result, the process flow is simplified, is faster and is performed at a lower cost.

As an alternative to known fabrication techniques for grayscale mask processes for microlens fabrication, the method of the invention is a method of fabricating grayscale mask using silicon-rich oxide (SRO) as light attenuating material. The lens shape is formed on 750 nm thick SRO film using multistep photolithography and etching processes. Refractive index matching of $SiO_xN_y$ to SRO eliminates light bending at the SRO/$SiO_xN_y$ interface. This is accomplished, partially, by planarizing a layer of $SiO_xN_y$ by CMP. The microlens fabrication process begins on the silicon wafer; once the microlens array is formed and necessary feature are patterned on the silicon wafer, the structured layers of the silicon wafer are transferred to a square quartz reticle plate using Smart Cut® technology, as described in U.S. Pat. No. 5,374,564, granted Dec. 20, 1994 to Bruel, for Process for the production of thin semiconductor material films.

In the bonding and transfer process used in this method, CMP is used to planarize the bonding surface to provide a strong bond. The bonding surface is treated to be hydrogen terminated, to allow greater bonding strength. After the initial bond, a curing anneal, at low temperature, and a splitting anneal, at a higher temperature, is performed to separate the silicon wafer and complete the Smart Cut® process.

Figure 1:
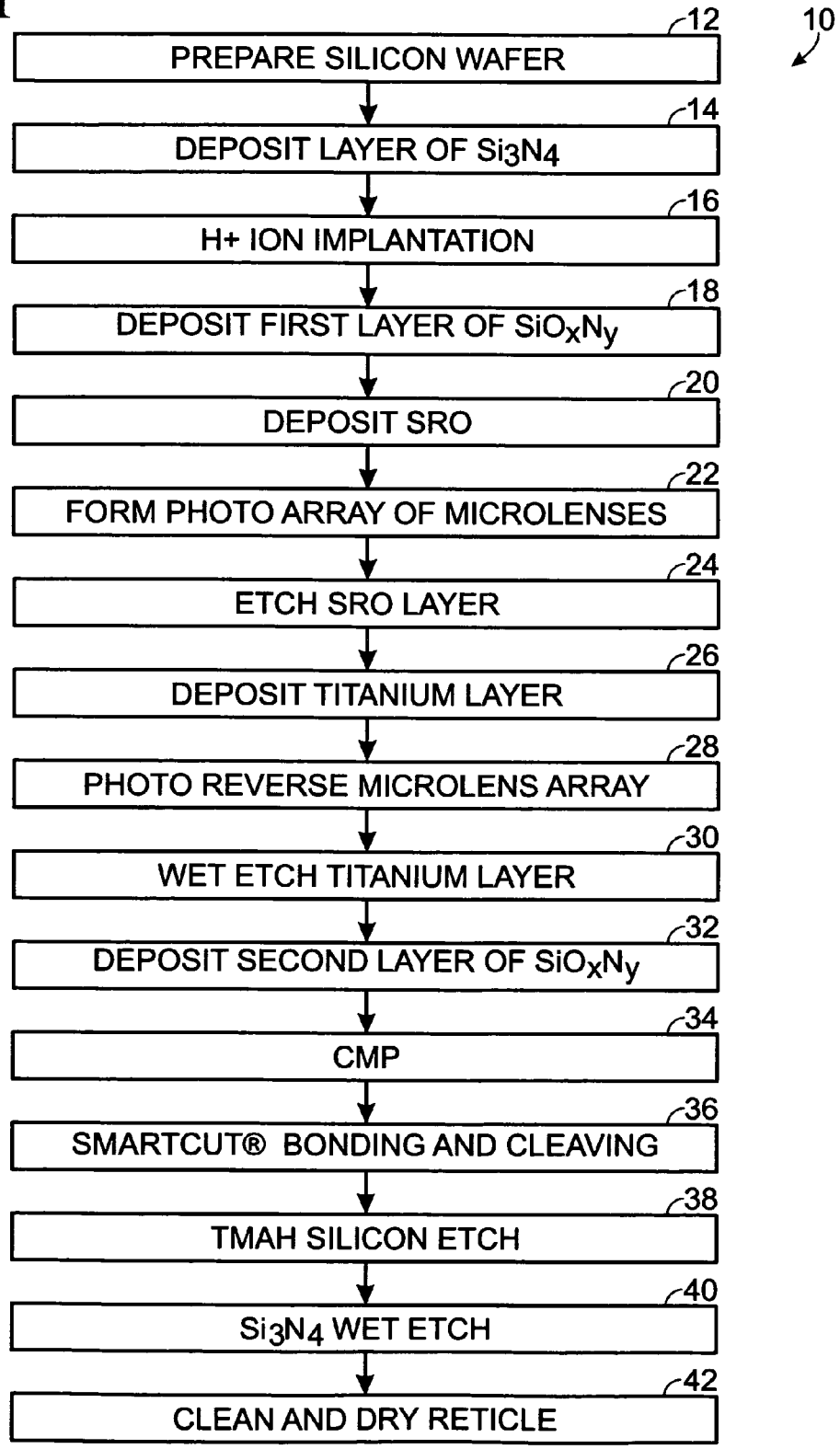
FIG. 1 is a block diagram of the method of the invention.

The method of the invention is depicted in FIG. 1, generally at 10. The H+ implantation, bonding, and cleaving steps are part of the Smart Cut® technology steps. The major process steps of the method of the invention are described as follows:

A silicon wafer is prepared, 12. An industry standard 150 mm diameter silicon wafer is suitable for use in the method of the invention. A layer of $Si_3N_4$ is deposited by LPCVD, 14, to a thickness of about 45 nm. This layer provides protection for a subsequently deposited layer of titanium, or other metal, during a subsequent $Si_3N_4$ wet etch in hot $H_3PO_4$. H+ ions are implanted, 16, as part of the Smart Cut® process. Implantation is conducted at an energy of about 40 KeV, at a dose of about 5E16.

A first layer of $SiO_xN_y$ is deposited 18 to a thickness of between about 10 nm to 100 nm, and is engineered to match the refractive index of a layer of SRO, which is next deposited 20 to a thickness of between about 500 nm to 1000 nm, with a preferred, optimum thickness of 700 nm, by PECVD. The refractive index of $SiO_xN_y$ is matched to the refractive index of the SRO, so that the reflection at the $SiO_xN_y$/SRO interface is minimized. It is critical to have this match because any mismatch on the refractive index will cause light bending at the interface, as well as reflection from the interface. The $SiO_xN_y$ layer is transparent and functions as overetch protection during subsequent SRO etching. The $SiO_xN_y$ may be replaced by other transparent metal oxides like $TiO_x$, $ZrO_x$, and $HfO_x$ (where x varies from 1 to 2) provided that the selected material has the requisite refractive index match with the SRO lens material. The deposition method may be sputtering, CVD, and PECVD. The photo array is formed, 22, using plural masks and plural exposure/development steps. The initial mask used in the method of the invention provides features being 25× that of the final desired feature size of the final microlens array. The SRO is etched 24 in a single step using plasma etching, resulting in a SRO thickness of about 700 nm.

A titanium layer is next deposited 26 to a thickness of between about 100 nm to 300 nm, by evaporation, and is used to form all the features on the reticle plate, such as alignment marks, fiducials, reticle label(s), etc. It also masks all the unused, non-active, areas on the plate. The photo image is then reversed, 28, and the titanium layer wet etched 30 using $NH_3OH$ and $H_2O_2$. Other metals, such as Al, Cr, V, Ni, Ag, Ta, etc., may be used in place of titanium, so long as chemical etch step 30 has sufficient selectivity between the selected metal and the underlying SRO.

Another, or second, layer of $SiO_xN_y$ is deposited 32 to a thickness of between about 1000 nm and 2000 nm and smoothed, or planarized, by CMP 34, to facilitate the bonding process. The $SiO_xN_y$ may again be replaced by other transparent metal oxides, again, provided that the material has a refractive index match with the SRO lens materials. After CMP of the $SiO_xN_y$, a layer of $SiO_2$, e.g., PECVD TEOS, may be needed to facilitate bonding process because the bonding strength between $SiO_xN_y$ and quartz is not as strong as the bonding strength of $SiO_2$ and quartz.

A Smart Cut® bonding and cleaving step, 36, is performed which transfers the features on the silicon wafer to the square shaped quartz plate, via high temperature anneal, e.g., at a temperature of between about 600° C. to 800° C., for between about 10 minutes to 60 minutes.

The silicon is then etched tetramethylammonium hydroxide (TMAH), 38, to remove any silicon remaining on the back side of the wafer after cleaving the wafer. This etch also removes any surface roughness, and stops at the level of the LPCVD $Si_3N_4$, which was deposited by LPCVD during step 18.

The $Si_3N_4$ layer is wet etched, 40, in hot $H_3PO_4$ to remove unnecessary $Si_3N_4$ on the optical path of the reticle, and to minimize the reflection and interference effect due to the high refractive index of the $Si_3N_4$. The wafer is then cleaned and dried, 42.

Figure 2:
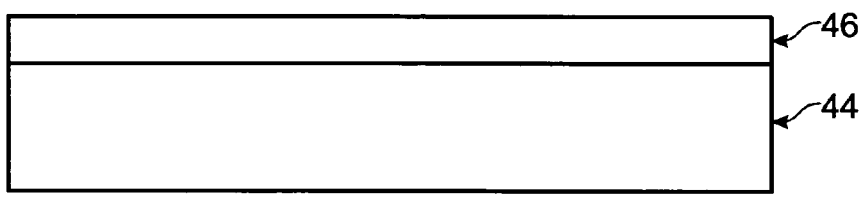
FIGS. 2 through 7 depicts steps in fabricating a microlens array according to the method of the invention.
Figure 3:
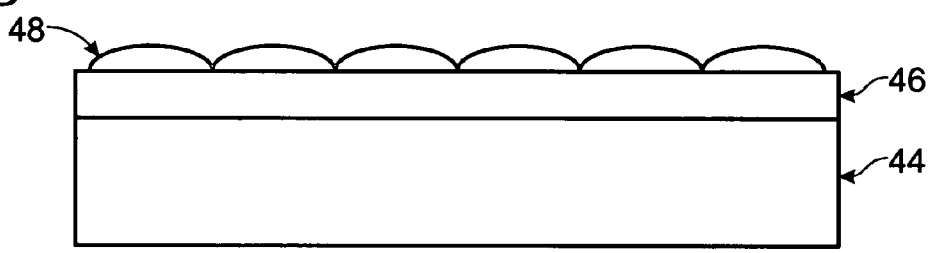
Figure 4:
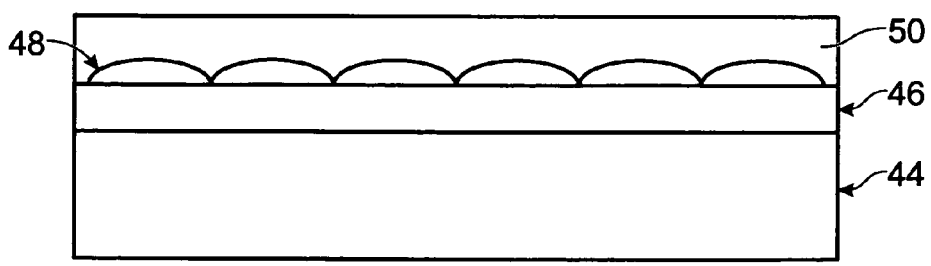

FIGS. 2-7 depicts the structure fabricated according to the method of the invention, which will be understood by one of ordinary skill in the art to include other conventional IC fabrication steps not shown in detail. For instance, deposition, patterning and removal of the titanium layer and other detailed features are omitted. FIG. 2 depicts the silicon wafer 44 after H+ ion implantation to form a defect layer 46. FIG. 3 depicts formation of a microlens array 48 following SRO lens etching of step 24. FIG. 4. depicts the lens structure after deposition of first $SiO_xN_y$ layer 50 and CMP, steps 32 and 34.

Figure 5:
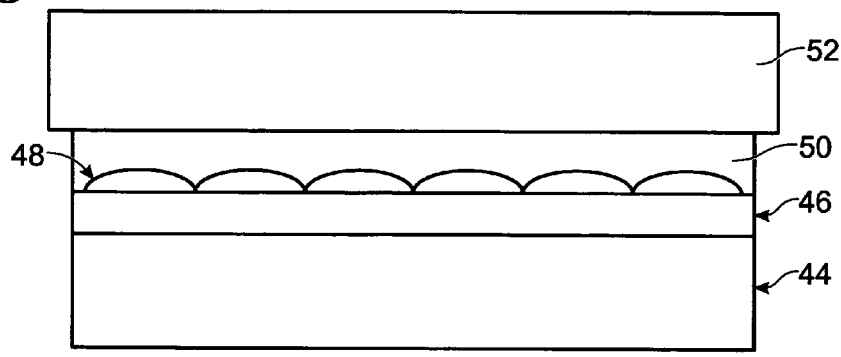
Figure 6:
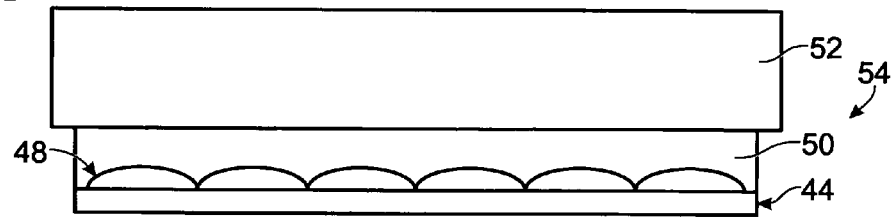
Figure 7:
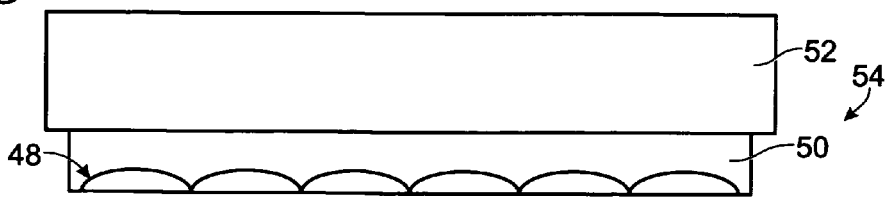

FIG. 5 depicts silicon wafer 44 after bonding to a quartz plate 52, part of step 36 to form a reticle 54. FIG. 6 depicts the structure after the silicon wafer is cleaved, part of step 36, by splitting across defect layer 46. and following an anneal. Finally, FIG. 7 depicts the wafer after any extra silicon is etched, 38. At this point in the method of the invention, the microlens array is 5× that of the finished microlens array which will be fabricated using the reticle fabricated according to the method of the invention.

Thus, a method for fabricating a grayscale mask using the Smart Cut® wafer bonding process has been disclosed. It will be appreciated that further variations and modifications thereof may be made within the scope of the invention as defined in the appended claims.

We claim:

1. A method of fabricating a grayscale mask, comprising:
preparing a silicon wafer;
depositing a layer of $Si_3N_4$ directly on the silicon wafer;
implanting H+ ions into the silicon wafer to form a defect layer;
depositing a first layer of $SiO_xN_y$ directly on the $Si_3N_4$ layer;
depositing a layer of SRO directly on the first layer of $SiO_xN_y$;
patterning a microlens array on the SRO layer;
etching the SRO layer to form a microlens array in the SRO layer;
depositing a second layer of $SiO_xN_y$ on the SRO microlens array;
CMP to planarize the second layer of $SiO_xN_y$;
bonding the planarized $SiO_xN_y$ to a quartz plate to form a graymask mask;
cleaving the silicon wafer along the defect layer;
etching to remove silicon from the grayscale mask;
etching to remove $SiO_xN_y$ and $Si_3N_4$ from the grayscale mask;
and cleaning and drying the grayscale mask.

2. The method of claim wherein a refractive index of the secsond $SiO_xN_y$ layer is matched to a refractive index of the SRO, so that the reflection at $SiO_xN_y$/SRO interface is minimized.

3. The method of claim 1 wherein refractive indices of the first $SiO_xN_y$ layer and the SRO layer are matched so that reflection and refraction are minimized at the $SRO/SiO_xN_y$-interface.

4. The method of claim 1 which includes, after said etching the SRO layer to form a microlens array in the SRO layer, depositing a layer of titanium on the microlens array, patterning the titanium layer using a photo image, and etching to remove the titanium layer.

5. The method of claim 1 which includes, after said CMP, depositing a layer of $SiO_2$ to facilitate bonding between $SiO_xN_y$ and the quartz plate.

6. The method of claim 1 wherein said etching to remove $Si_3N_4$ from the grayscale mask includes wet etching in hot $H_3PO_4$ to remove $Si_3N_4$ on the optical path of the reticle to minimize reflection and interference produces as a result of the high refractive index of $Si_3N_4$.

7. A method of fabricating a grayscale mask, comprising:
preparing a silicon wafer;
depositing a layer of $Si_3N_4$ directly on the silicon wafer;
implanting $H^+$ ions into the silicon wafer to form a defect layer;
depositing a first layer of a transparent metal oxide directly on the $Si_3N_4$ layer;
depositing a layer of SRO directly on the first layer of transparent metal oxide patterning a microlens array on the SRO layer;
etching the SRO layer to form a microlens array in the SRO layer;
depositing a metal layer;
using a photo image to form a metal layer pattern;
depositing a second layer of a transparent metal oxide on the SRO microlens array, wherein a refractive index of the second transparent metal oxide layer is matched to a refractive index of the SRO, so that the reflection at the transparent metal oxide /SRO interface is minimized;
CMP to planarize the second layer of transparent metal oxide;
bonding the planarized transparent metal oxide to a quartz plate to form a grayscale mask;
cleaving the silicon wafer along the defect layer;
etching to remove silicon from the grayscale mask;
etching to remove transparent metal oxide and $Si_3N_4$ from the grayscale mask; and
cleaning and drying the grayscale mask.

8. The method of claim 7 wherein refractive indices of the first transparent metal oxide layer and the SRO layer are matched so that reflection and refraction are minimized at the SRO/transparent metal oxide interface.

9. The method of claim 7 wherein depositing the metal layer includes depositing a layer of titanium on the microlens array;
and, wherein forming the metal layer pattern includes patterning the titanium layer using the photo image, and after said photo imaging, etching to remove the titanium layer.

10. The method of claim 7 which includes, after said CMP, depositing a layer of $SiO_2$ to facilitate bonding between the transparent metal oxdie and the quartz plate.

11. The method of claim 7 wherein said etching to remove $Si_3N_4$ from the grayscale mask includes wet etching in hot $H_3PO_4$ to remove $Si_3N_4$ on the optical path of the reticle to minimize reflection and interference produces as a result of the high refractive index of $Si_3N_4$.

12. The method of claim 7 wherein the transparent metal oxdie is $SiO_xN_y$.

13. A method of fabricating a grayscale mask, comprising:
preparing a silicon wafer;
depositing a layer of $Si_3N_4$ directly on the silicon wafer;
implanting $H^+$ ions into the silicon wafer to form a defect layer;
depositing a first layer of $SiO_xN_y$ directly on the $Si_3N_4$ layer;
depositing a layer of SRO directly on the first layer of $SiO_xN_y$, wherein refractive indices of the first $SiO_xN_y$ layer and the SRO layer are matched so that reflection and refraction are minimized at the $SRO/SiO_xN_y$ interface;
patterning a microlens array on the SRO layer;
etching the SRO layer to form a microlens array in the SRO layer;
depositing a second layer of $SiO_xN_y$ on the SRO microlens array;
CMP to planarize the second layer of $SiO_xN_y$;
bonding the planarized $SiO_xN_y$ to a quartz plate to form a grayscale mask;
cleaving the silicon wafer along the defect layer;
etching to remove silicon from the grayscale mask;
etching to remove $SiO_xN_y$ and $Si_3N_4$ from the grayscale mask; and
cleaning and drying the grayscale mask.

14. The method of claim 13 wherein a refractive index of the second $SiO_xN_y$ layer is matched to a refractive index of the SRO, so that the reflection at the $SiO_{xy}$ /SRO interface is minimized.

15. The method of claim 13 which includes, after said etching the SRO layer to form a microlens array in the SRO layer, depositing a layer of titanium on the microlens array, patterning the titanium layer using a photo image, and etching to remove the titanium layer.

16. The method of claim 13 which includes, after said CMP, depositing a layer of $SiO_2$ to facilitate bonding between $SiO_xN_y$ and the quartz plate.

17. The method of claim 13 wherein said etching to remove $Si_3N_4$ from the grayscale mask includes wet etching in hot $H_3PO_4$ to remove $Si_3N_4$ on the optical path of the reticle to minimize reflection and interference produces as a result of the high refractive index of $Si_3N_4$.

* * * * *

UNITED STATES PATENT AND TRADEMARK OFFICE
CERTIFICATE OF CORRECTION

PATENT NO.        : 7,838,174 B2
APPLICATION NO.   : 11/657258
DATED             : November 23, 2010
INVENTOR(S)       : Wei Gao et al.

It is certified that error appears in the above-identified patent and that said Letters Patent is hereby corrected as shown below:

In column 4, line 64, the number "1" is missing between the word "claim" and the word "wherein. The claim should be printed as follows:

2. The method of claim 1 wherein a refractive index of the second SiOxNy layer is matched to a refractive index of the SRO, so that the reflection at the SiOxNy/SRO interface is minimized.

In column 5, line 3, a space is missing between the word "refraction" and the word "are".
The claim should be written as follows:

3. The method of claim 1 wherein refractive indices of the first SiOxNy layer and the SRO layer are matched so that reflection and refraction are minimized at the SRO/SiOxNy interface.

Signed and Sealed this
Eleventh Day of January, 2011

David J. Kappos
*Director of the United States Patent and Trademark Office*